United States Patent
Lin

(10) Patent No.: US 9,508,558 B2
(45) Date of Patent: Nov. 29, 2016

(54) WAFER TREATMENT SOLUTION FOR EDGE-BEAD REMOVAL, EDGE FILM HUMP REDUCTION AND RESIST SURFACE SMOOTH, ITS APPARATUS AND EDGE-BEAD REMOVAL METHOD BY USING THE SAME

(71) Applicant: I-Shan Ke, New Taipei (TW)

(72) Inventor: Yu-Hsun Lin, Taichung (TW)

(73) Assignee: I-Shan Ke, New Taipei (TW)

( * ) Notice: Subject to any disclaimer, the term of this patent is extended or adjusted under 35 U.S.C. 154(b) by 51 days.

(21) Appl. No.: 14/591,044

(22) Filed: Jan. 7, 2015

(65) Prior Publication Data

US 2016/0056049 A1 Feb. 25, 2016

(30) Foreign Application Priority Data

Aug. 25, 2014 (TW) .............................. 103129216 A

(51) Int. Cl.
| | |
|---|---|
| *C11D 7/50* | (2006.01) |
| *H01L 21/306* | (2006.01) |
| *H01L 21/308* | (2006.01) |
| *C11D 11/00* | (2006.01) |
| *H01L 21/67* | (2006.01) |

(52) U.S. Cl.
CPC ....... *H01L 21/30604* (2013.01); *C11D 7/5013* (2013.01); *C11D 7/5018* (2013.01); *C11D 11/0041* (2013.01); *H01L 21/3081* (2013.01); *H01L 21/6708* (2013.01)

(58) Field of Classification Search
CPC .................................................. C11D 11/0047
See application file for complete search history.

(56) References Cited

U.S. PATENT DOCUMENTS

| | | | | |
|---|---|---|---|---|
| 4,661,436 A | | 4/1987 | Lewis et al. | |
| 6,267,853 B1 * | | 7/2001 | Dordi ................... | C25D 17/001 204/232 |
| 6,310,017 B1 * | | 10/2001 | Grant ................... | C11D 3/3947 134/2 |
| 8,906,590 B2 * | | 12/2014 | Rahman ................ | C08G 61/02 430/270.1 |
| 2003/0157441 A1 * | | 8/2003 | Ahn ........................ | G03F 7/422 430/329 |
| 2003/0180999 A1 * | | 9/2003 | Endisch ................ | B08B 7/0092 438/200 |
| 2004/0076910 A1 * | | 4/2004 | Rutter, Jr. ............... | G03F 7/426 430/311 |
| 2005/0196535 A1 * | | 9/2005 | Weigel ................. | C11D 11/0047 427/271 |
| 2006/0130747 A1 * | | 6/2006 | Ishikawa ................ | G03B 27/32 118/52 |
| 2011/0171583 A1 * | | 7/2011 | Zhang ................... | G03F 7/0048 430/319 |
| 2011/0195190 A1 * | | 8/2011 | Koshiyama .............. | C09K 3/18 427/284 |

(Continued)

Primary Examiner — Gregory Webb
(74) Attorney, Agent, or Firm — McClure, Qualey & Rodack, LLP

(57) ABSTRACT

The present disclosure provides a wafer treatment solution for edge-bead removal, edge film hump reduction and resist surface smooth. The wafer treatment solution includes a solution and a fluorine-containing additive mixed in the solution. The fluorine-containing additive has a following formula (I): $R_f$—X—$(CH_2CH_2O)_m$—$R_1$ (I); or a following formula (II):

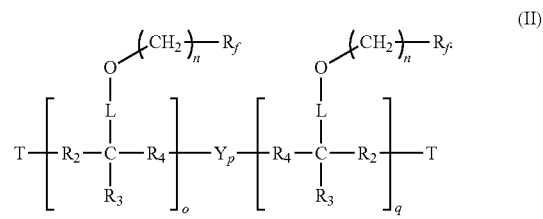

An apparatus and a method by using the wafer treatment solution are also provided herein.

20 Claims, 9 Drawing Sheets

(56) References Cited

U.S. PATENT DOCUMENTS

| | | | |
|---|---|---|---|
| 2012/0108067 A1* | 5/2012 | Neisser | C11D 3/373 438/694 |
| 2013/0123411 A1* | 5/2013 | Quillen | C11D 7/34 524/377 |
| 2013/0228901 A1* | 9/2013 | Dershem | H01L 21/02282 257/632 |
| 2014/0038109 A1* | 2/2014 | Rahman | G03F 7/094 430/319 |
| 2014/0137894 A1* | 5/2014 | Peters | B08B 7/0014 134/19 |
| 2014/0142017 A1* | 5/2014 | Peters | C11D 7/3218 510/176 |
| 2014/0190529 A1* | 7/2014 | Ganesan | H01L 21/02087 134/95.1 |
| 2014/0342287 A1* | 11/2014 | Wright | G03F 7/038 430/270.1 |
| 2016/0056049 A1* | 2/2016 | Lin | H01L 21/30604 510/176 |

* cited by examiner

WAFER TREATMENT SOLUTION FOR EDGE-BEAD REMOVAL, EDGE FILM HUMP REDUCTION AND RESIST SURFACE SMOOTH, ITS APPARATUS AND EDGE-BEAD REMOVAL METHOD BY USING THE SAME

RELATED APPLICATIONS

This application claims priority to Taiwan Application Serial Number 103129216, filed Aug. 25, 2014, which is herein incorporated by reference.

BACKGROUND

Field of Invention

The present disclosure relates to a wafer treatment solution for cleaning a semiconductor wafer. More particularly, the present disclosure relates to a fluorine-containing wafer treatment solution for cleaning a semiconductor wafer, and an apparatus and a method for surface roughness smoothing and removing and flattening at least one edge film hump at an edge of a semiconductor wafer by the wafer treatment solution.

Description of Related Art

In fabricating a general semiconductor element, a multi-layer structure is usually formed on a semiconductor wafer. In the process of forming the multi-layer structure, a photoresist layer is applied on the semiconductor wafer to perform a plurality of patterning processes of the semiconductor wafer. The photoresist layer is normally formed on the semiconductor wafer by a spin-coating method.

When the semiconductor wafer is spun, an appropriate amount of a photoresist agent is spray near the surface of the center of the semiconductor wafer, and then the photoresist agent is spray from the center of the semiconductor wafer to edges of the semiconductor wafer by a centrifugal force, so as to form a photoresist layer on the surface of the semiconductor wafer. However, the spin-coated photoresist agent may form a plurality of edge resist beads with different sizes at the edges of the semiconductor wafer near the edge wall and the bottom surface of the semiconductor wafer.

Currently, a typical treatment solution for edge bead removal (EBR) is an organic solution prepared by alcohols, ethers or ether esters to dissolve the edge resist beads. When the edge resist beads are removed by the organic solution, a plurality of photoresist film humps at the very edge of the semiconductor wafer is formed at an interface area of the edge photoresist film contacting the organic solution. The photoresist film humps may affect an exposure focus accuracy of a lithography process to cause image distortion. Further, the photoresist film humps may also result in incompletely etching or removing after etching, and the residual humps may peel at following processes or cause that other films formed thereon are not easily attached, which is a contamination source of harmful particles at the following processes, and may cause a great damage on semiconductor elements formed on the semiconductor wafer.

Therefore, there is a need for an improved wafer treatment solution and a method for edge bead removal by using the wafer treatment solution to solve the aforementioned problems met in the art.

SUMMARY

The present disclosure provides a wafer treatment solution, and an apparatus and a method for edge bead removal by using the same, so as to solve the aforementioned problems met in the art and increase an efficiency of edge bead removal to decrease the damage on a semiconductor element. The wafer treatment solution may also be applied to treat a film surface to improve a roughness of the film surface.

An embodiment of the present disclosure is provided a wafer treatment solution including a solution and a fluorine-containing additive dispersed in the solution, and having a compound of a formula (I):

wherein $R_f$ is a C1-C6 fluorine-containing alkyl group; R1 is hydrogen, a C1-C3 alkyl group, C1-C3 alcohol group, C1-C3 carboxylic group or C1-C3 amino group ($-NH_2$); X is $-O-$, $-NH-$, $-SO_3NH-$, $-COO-$, $-CH_2O-$ or $-CO-$; and m is an integer of 1-6; or a compound of a formula (II):

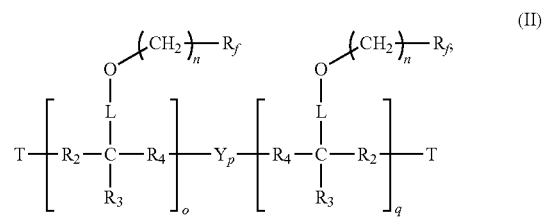

wherein $R_f$ is a C1-C6 fluorine-containing alkyl group; R2 is $-CH_2-$; $R_3$ is a C1-C3 alkyl group, a C1-C3 alkoxyl group, a C1-C3 alkyloyl group, amino group ($-NH_2$) or hydroxyl group ($-OH$); R4 is $-CH_2O-$ or $-CH_2-$; Y is

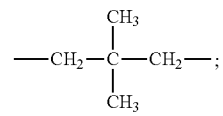

L is unsubstituted or $-(CH_2)_n-$; n is an integer of 1-3; o and q are individually an integer of 1-8; p is an integer of 1-3; and T is $-OH$, $-OSO_3^-NH_4^+$, $-OSO_3^-Na^+$, $-OSO_3^-K^+$, $-NH_2$ or $-COOH$.

According to various embodiments of the present disclosure, the fluorine-containing additive has the compound of the formula (I), wherein $R_f$ is a C6 perfluoroalkyl group, R1 is hydrogen, X is oxygen, and m is 2, so that the chemical structure of the fluorine-containing additive is formula (III):

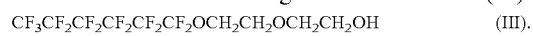

According to various embodiments of the present disclosure, the fluorine-containing additive has the compound of the formula (II), wherein $R_f$ is a C1-C6 fluorine-containing alkyl group, R2 is $-CH_2-$, $R_3$ is $-CH_3$, $R_4$ is $-CH_2O-$, Y is

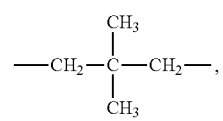

L is $-CH_2-$, n is 2, o and q are individually an integer of 1-8, p is an integer of 1-3, and T is $-OH$, $-OSO_3^-NH_4^+$, $-OSO_3^-Na^+$, $-OSO_3^-K^+$, $-NH_2$ or $-COOH$, so that the chemical structure of the fluorine-containing additive is formula (III):

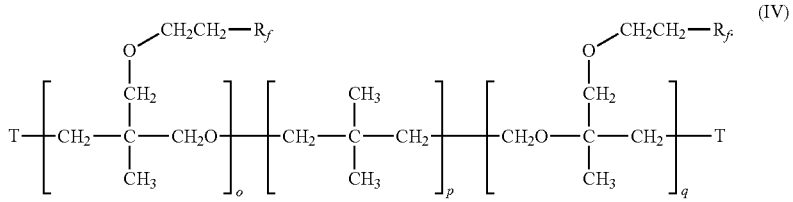

According to various embodiments of the present disclosure, the content of the fluorine-containing additive in the wafer treatment solution is in a range of 0.05-5 wt %.

According to various embodiments of the present disclosure, the content of the fluorine-containing additive in the wafer treatment solution is in a range of 0.1-1 wt %.

According to various embodiments of the present disclosure, the solution is selected from the group consisting of propylene glycol methyl ether (PGME), propylene glycol methyl ether acetate (PGMEA), cyclohexanol, cyclohexanone, γ-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

According to various embodiments of the present disclosure, the solution is a mixed solution of PGME and PGMEA, and the weight ratio of PGME and PGMEA is 70:30.

Another embodiment of the present disclosure is provided a method for edge-bead removal. The method includes following processes. A photoresist layer is formed on a semiconductor wafer, and the semiconductor wafer is positioned on and in contact with a rotatable wafer chuck. The semiconductor wafer is rotated, and the wafer treatment solution is spray on an edge of a top surface of the semiconductor wafer or an edge of a bottom surface opposite to the edge of the top surface.

According to various embodiments of the present disclosure, spraying the wafer treatment solution further includes spraying a solution on the edge of the top surface of the semiconductor wafer at the same time.

According to various embodiments of the present disclosure, the method further includes spraying a solution on the edge of the top surface of the semiconductor wafer before spraying the wafer treatment solution.

According to various embodiments of the present disclosure, the method further includes spraying a solution on the edge of the top surface of the semiconductor wafer after spraying the wafer treatment solution.

According to various embodiments of the present disclosure, the solution and the solution of the wafer treatment solution are individually selected from the group consisting of propylene glycol methyl ether (PGME), propylene glycol methyl ether acetate (PGMEA), cyclohexanol, cyclohexanone, γ-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

According to various embodiments of the present disclosure, the solution and the solution of the wafer treatment solution are a mixed solution of PGME and PGMEA, and the weight ratio of PGME and PGMEA is 70:30.

According to various embodiments of the present disclosure, the method further includes decreasing a thickness of at least one edge film hump on the semiconductor wafer by the wafer treatment solution.

According to various embodiments of the present disclosure, the thickness of the edge film hump is decreased at least 50%.

Further another embodiment of the present disclosure is provided an apparatus for edge-bead removal including a rotatable wafer chuck, a first nozzle and a second nozzle.

The first nozzle is positioned on the rotatable wafer chuck, and is near an edge of a top surface of a semiconductor wafer on the rotatable wafer chuck. The first nozzle is used to spray the wafer treatment solution to the edge of the top surface of the semiconductor wafer.

The second nozzle is positioned under the rotatable wafer chuck, and is near an edge of a bottom surface opposite to the edge of the top surface of a semiconductor wafer positioned on the rotatable wafer chuck. The second nozzle is used to spray the wafer treatment solution to the edge of the bottom surface of the semiconductor wafer.

According to various embodiments of the present disclosure, the apparatus further includes a third nozzle positioned on the rotatable wafer chuck, and near an edge of the top surface of the semiconductor wafer on the rotatable wafer chuck, wherein the third nozzle is used to spray a solution to the edge of the top surface of the semiconductor wafer.

According to various embodiments of the present disclosure, the solution and the solution of the wafer treatment solution are individually selected from the group consisting of propylene glycol methyl ether (PGME), propylene glycol methyl ether acetate (PGMEA), cyclohexanol, cyclohexanone, γ-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

According to various embodiments of the present disclosure, the solution and the solution of the wafer treatment solution are a mixed solution of PGME and PGMEA, and the weight ratio of PGME and PGMEA is 70:30.

Yet another embodiment of the present disclosure is provided a method for flattening a photoresist layer on a surface of a semiconductor wafer. The method includes following processes. The photoresist layer is formed on the semiconductor wafer. A solvent film is formed on the photoresist layer, and the solvent film is formed of the wafer treatment solution.

According to various embodiments of the present disclosure, the method further includes performing a heating process after forming the solvent film on the photoresist layer.

According to various embodiments of the present disclosure, a heating temperature of the heating process is in a range of 90-140° C., and a heating time is in a range of 60-90 seconds.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
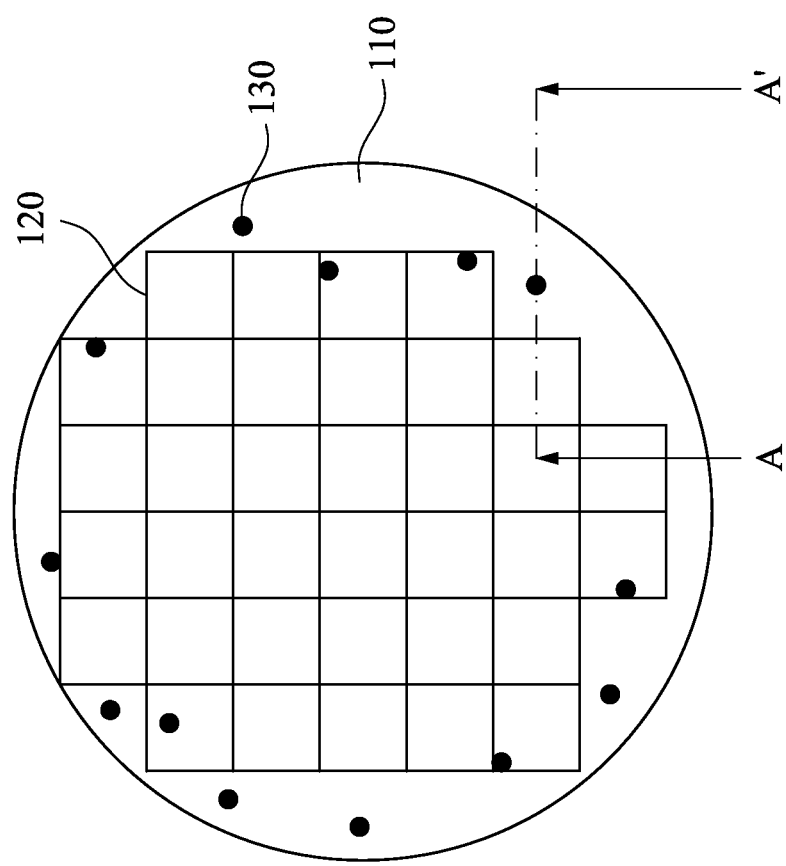
FIG. 1 is a schematic top view of a general semiconductor wafer 110.

The embodiments of the transparent heat-conducting structure and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a metal layer includes embodiments having two or more such metal layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

A general photoresist agent is usually attached on a surface of a semiconductor wafer by intermolecular non-covalent interactions. However, when the semiconductor wafer is spun to coat a photoresist layer, an excess amount of a photoresist agent may be accumulated at edges of the semiconductor wafer, and even a part of the photoresist agent may flow to a bottom surface of the edges of the semiconductor wafer by a capillary action while spin-coating the photoresist layer. The bead-like photoresist residues formed at the edges of the semiconductor wafer are shown as in FIGS. 5A-5B.

When the semiconductor wafer is transferred by a mechanical device, the mechanical device may be contaminated because of contacting the bead-like photoresist residues formed at the edges of the semiconductor wafer. Thus, a photoresist solvent, such as a mixed solution of propylene glycol methyl ether (PGME) and propylene glycol methyl ether acetate (PGMEA), is applied to remove the bead-like photoresist residues formed at the edges of the semiconductor wafer, so as to prevent the contamination of the mechanical device. However, a plurality of photoresist film humps are usually formed at an interface of the edge photoresist film contacting an organic solution while removing the bead-like photoresist residues formed at the edges of the semiconductor wafer. Referring to FIG. 1, FIG. 1 is a schematic top view of a general semiconductor wafer 110. In FIG. 1, the semiconductor wafer 110 includes a plurality of semiconductor elements 120 formed on the semiconductor wafer 110 and a plurality of edge film humps or edge film hump peeling particles 130 spread on the semiconductor wafer 110.

Generally, the bead-like photoresist residues formed at the edges of the semiconductor wafer are removed by dissolving in a general wafer treatment solution. The wafer treatment solution may be absorbed into the photoresist layer at the edges of the semiconductor wafer to cause the interface of the very edges of the photoresist layer absorbing a part of the wafer treatment solution, so that a plurality of edge film humps 130 having minimum surface tension are formed because the absorbed solvent from wafer treatment solution reduce the photoresist polymer (Tg) and the polymer is reflowed to become a hump. The edge film humps may cause exposure defocus in following semiconductor processes, etch residue, and may peel at following processes or cause that other films formed thereon are not easily attached, which is a contamination source of harmful particles at the following processes, and may cause a great damage on semiconductor elements formed on the semiconductor wafer. For solving the aforementioned problems met in the art, various embodiments of the present disclosure are provided a wafer treatment solution, and an apparatus and a method for edge bead removal by using the same.

An embodiment of the present disclosure is provided a wafer treatment solution including a solution and a fluorine-containing additive dispersed in the solution. The fluorine-containing additive has a polar functional group and a non-polar functional group. The photoresist film absorbing the wafer treatment solution, which generates a great intermolecular interactions when polymer is surrounded with absorbed solvent, may be reduced, isolated, and damaged by the non-polar functional group of the fluorine-containing additive, so as to inhibit the formation of edge film hump.

Another embodiment of the present disclosure is provided a wafer treatment solution including a solution and a fluorine-containing additive dispersed in the solution. The fluorine-containing additive has a polar functional group and a non-polar functional group. The intermolecular interactions among photoresist polymers are damaged by the non-polar functional group of the fluorine-containing additive, which makes that the polymers reflow on the surface of the photoresist layer under a heating condition because of decreasing the intermolecular interactions among photoresist polymers, so as to reduce the surface roughness of the photoresist film. The wafer treatment solution may be formed on a photoresist pattern of a semiconductor wafer surface by coating, spraying or evaporating. Further, a heating process may be performed to make the photoresist polymers reflow. According to various embodiments of the present disclosure, a heating temperature of the heating process is in a range of 80-150° C., and a heating time is in a range of 30-90 seconds. According to various embodiments of the present disclosure, a heating temperature of the heating process is in a range of 90-140° C., and a heating time is in a range of 60-90 seconds.

For example, the wafer treatment solution has a compound of a formula (I):

$$R_f\text{—}X\text{—}(CH_2CH_2O)_m\text{—}R_1 \qquad (I),$$

wherein $R_f$ is a C1-C6 fluorine-containing alkyl group; R1 is hydrogen, a C1-C3 alkyl group or amino group (—$NH_2$); X is —O—, —NH—, —$SO_3NH$—, —COO—, —$CH2O$— or —CO—; and m is an integer of 1-6. In the formula (I), the group, $(CH_2CH_2O)_m$—$R_1$, is a polar functional group; and the group, $R_f$, is a non-polar functional group.

According to various embodiments of the present disclosure, the fluorine-containing additive has the compound of the formula (I), wherein $R_f$ is a C6 perfluoroalkyl group, R1 is hydrogen, X is $CH_2O$, and m is 2, so that the chemical structure of the fluorine-containing additive is formula (III):

$$CF_3CF_2CF_2CF_2CF_2CF_2CH_2OCH_2CH_2OCH_2CH_2OH \qquad (III).$$

In the chemical structure (III), the group, $CF_3CF_2CF_2CF_2CF_2CF_2$, is a non-polar functional group; and the group, $OCH_2CH_2OCH_2CH_2OH$, is a polar functional group.

Another wafer treatment solution has a compound of a formula (II):

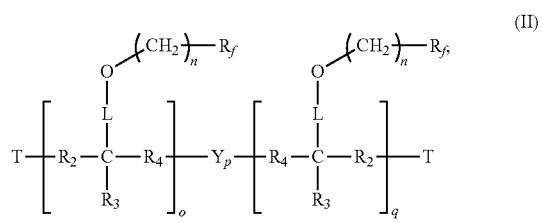

wherein $R_f$ is a C1-C6 fluorine-containing alkyl group; R2 is —$CH_2$—; $R_3$ is a C1-C3 alkyl group, a C1-C3 alkoxyl group, a C1-C3 alkyloyl group, amino group (—$NH_2$) or hydroxyl group (—OH); R4 is —$CH_2O$— or —$CH_2$—; Y is

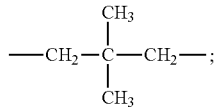

L is unsubstituted or —$(CH_2)_n$—; n is an integer of 1-3; o and q are individually an integer of 1-8; p is an integer of 1-3; and T is —OH, —$OSO_3^-NH_4^+$, —$OSO_3^-Na^+$, —$OSO_3^-K^+$, —$NH_2$ or —COOH. In the formula (II), the group, —O-L-, T and $R_4$, is a polar functional group; and the group, $R_f$, is a non-polar functional group.

According to various embodiments of the present disclosure, the fluorine-containing additive has the compound of the formula (II), wherein $R_f$ is a C1-C6 fluorine-containing alkyl group, R2 is —$CH_2$—, $R_3$ is —$CH_3$, R4 is —$CH_2O$—, Y is

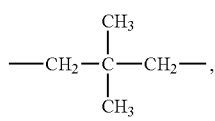

L is —$CH_2$—, n is 2, o and q are individually an integer of 1-8, p is an integer of 1-3, and T is —OH, —$OSO_3^-NH_4^+$, —$OSO_3^-Na^+$, —$OSO_3^-K^+$, —$NH_2$ or —COOH, so that the chemical structure of the fluorine-containing additive is formula (III):

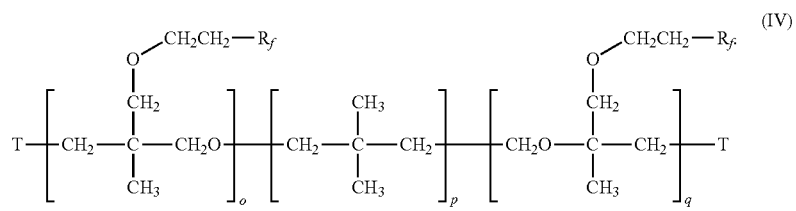

In the chemical structure (IV), the group, $R_f$, is a non-polar functional group; and the group, —$CH_2O$— and —OH, is a polar functional group.

According to various embodiments of the present disclosure, the solution is selected from the group consisting of propylene glycol methyl ether (PGME), propylene glycol methyl ether acetate (PGMEA), cyclohexanol, cyclohexanone, γ-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

According to various embodiments of the present disclosure, the solution is a mixed solution of PGME and PGMEA, and the weight ratio of PGME and PGMEA is 70:30.

According to various embodiments of the present disclosure, the content of the fluorine-containing additive in the wafer treatment solution is in a range of 0.05-5 wt %.

According to various embodiments of the present disclosure, the content of the fluorine-containing additive in the wafer treatment solution is in a range of 0.1-1 wt %.

Figure 2A:
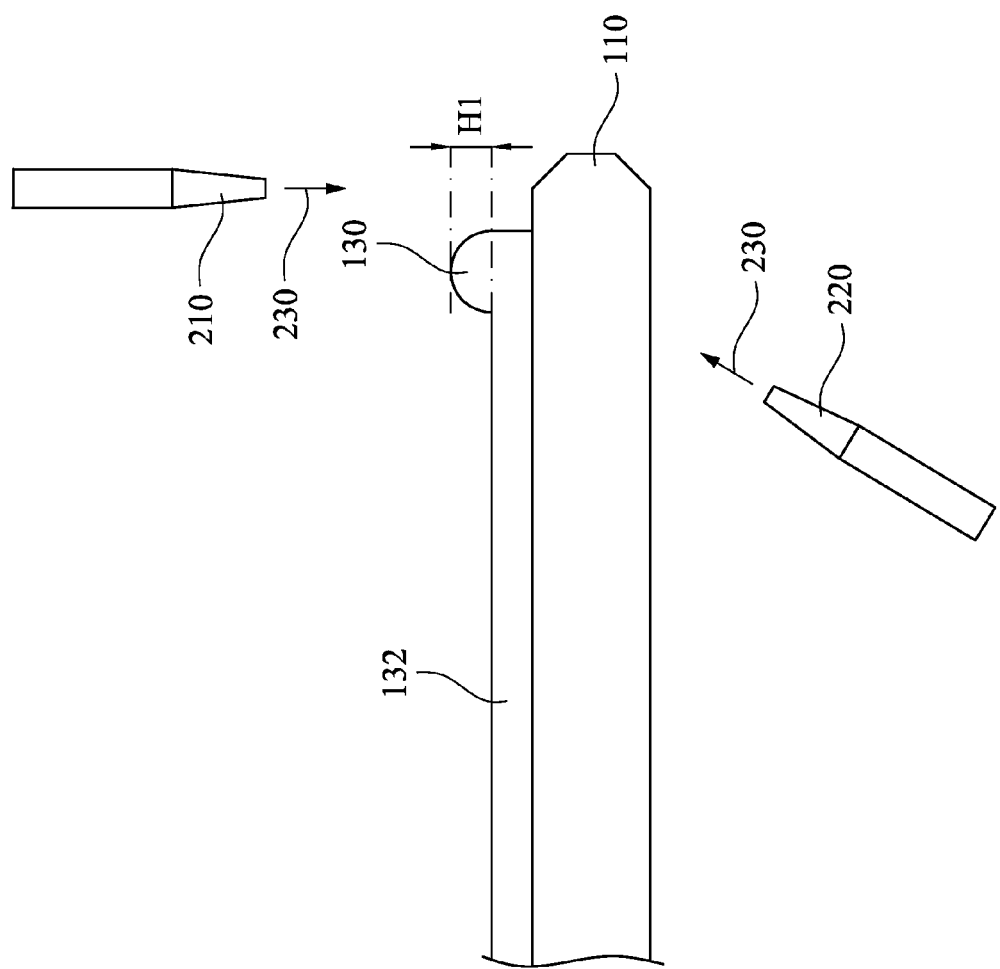
FIGS. 2A-2B are schematic cross-sectional views of the semiconductor wafer 110 taken along the A-A' line of FIG. 1, and the semiconductor wafer 110 is positioned in an apparatus for edge bead removal and inhibiting the formation of edge film humps.

Another embodiment of the present disclosure is provided an apparatus for edge-bead removal and inhibiting a formation of edge film humps by applying the wafer treatment solution. Referring to FIG. 2A, FIG. 2A is a schematic cross-sectional view of the semiconductor wafer 110 taken along the A-A' line of FIG. 1, and the semiconductor wafer 110 is positioned in an apparatus for edge bead removal and inhibiting the formation of edge film humps. In FIG. 2A, a photoresist layer 132 is formed on the semiconductor wafer 110, and the photoresist layer 132 has a plurality of edge film hump 130 formed on edges of the semiconductor wafer 110, wherein a thickness of the edge film hump 130 is H1.

In the apparatus for edge-bead removal and inhibiting a formation of edge film humps, the first nozzle 210 is used to spray the wafer treatment solution 230 to the edge of the top surface of the semiconductor wafer 110. The second nozzle 220 is used to spray the wafer treatment solution 230 to the edge of the bottom surface of the semiconductor wafer 110. According to various embodiments of the present disclosure, the wafer treatment solution 230 is a wafer treatment solution containing a fluorine-containing additive, and the fluorine-containing additive has compound of a formula (I), (II), (III) or (IV).

Figure 2B:
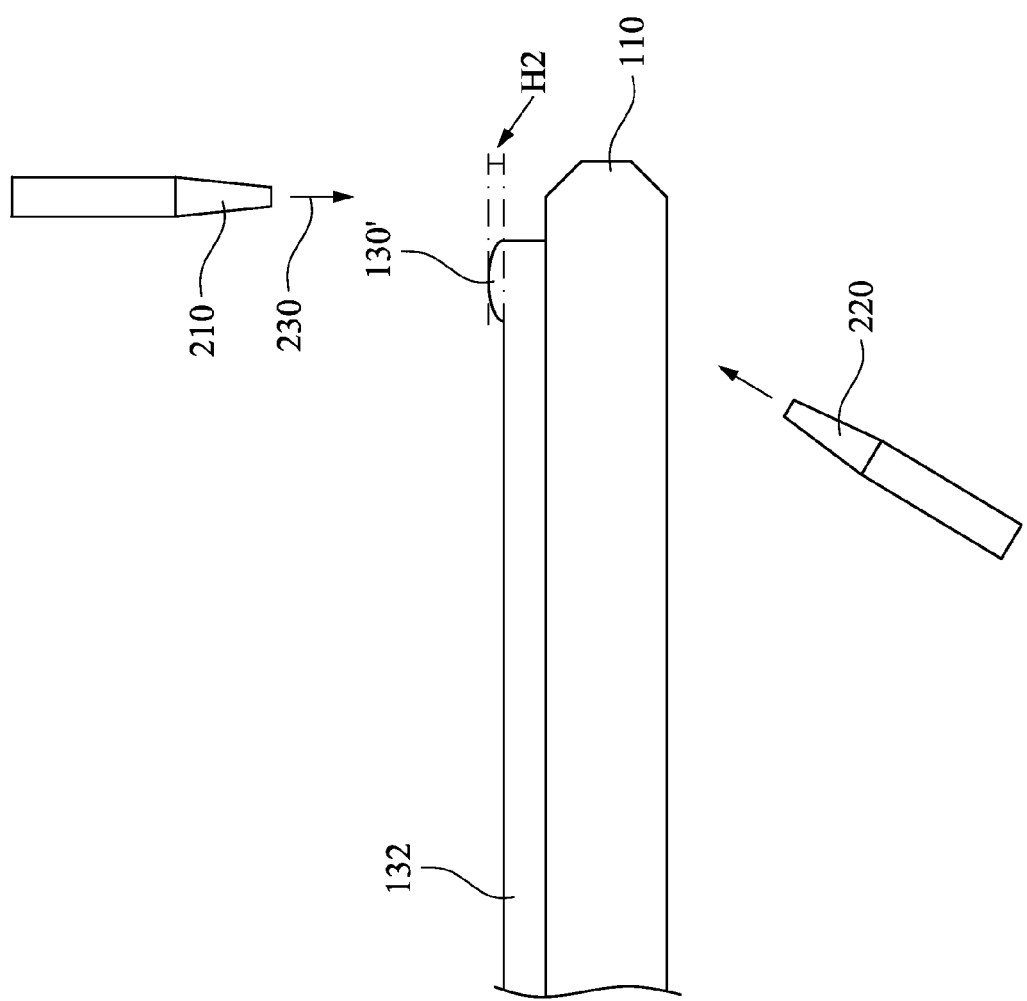

FIG. 2B is a schematic cross-sectional view of the semiconductor wafer 110, and the semiconductor wafer 110 is positioned in an apparatus for edge bead removal and inhibiting the formation of edge film humps. After cleaning the semiconductor wafer 110 of FIG. 2A by the wafer treatment solution 230, a thickness (H2) of the edge film humps 130' formed of the photoresist layer 132 on the semiconductor wafer 110 is significantly reduced. According to various embodiments of the present disclosure, compared to the thickness (H1) of the edge film humps 130 of FIG. 2A, the thickness (H2) of the edge film humps 130' is decreased at least 50%.

Figure 3:
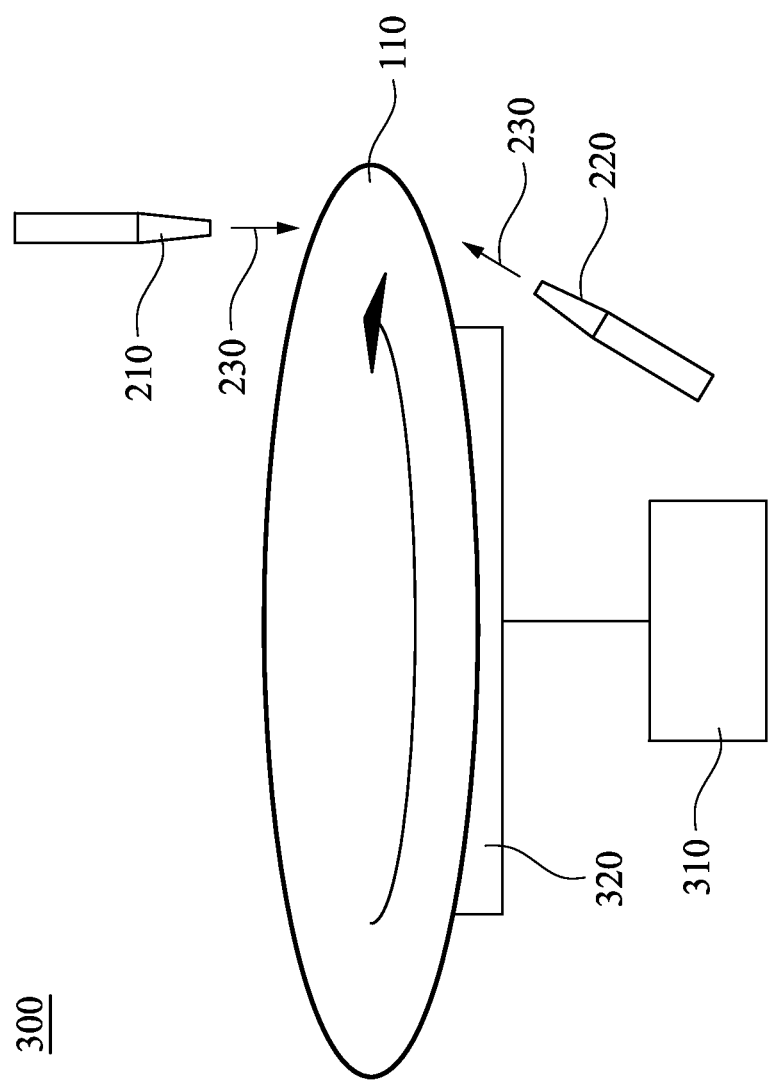
FIG. 3 is a schematic view of an apparatus 300 for edge bead removal and inhibiting the formation of edge film humps according an embodiment of the present disclosure.

Referring to FIG. 3, FIG. 3 is a schematic view of an apparatus 300 for edge bead removal and inhibiting the formation of edge film humps according an embodiment of the present disclosure. In FIG. 3, the apparatus 300 includes a rotatable wafer chuck 320, a first nozzle 210 and a second nozzle 220. The rotatable wafer chuck 320 is spun by a rotating motor 310, and fixes the semiconductor wafer 110 which may not slide.

The first nozzle 210 is positioned on the rotatable wafer chuck 320, and is near an edge of a top surface of a semiconductor wafer 110 on the rotatable wafer chuck 320. The first nozzle 210 is used to spray the wafer treatment solution 230 to the edge of the top surface of the semiconductor wafer 110.

The second nozzle 220 is positioned under the rotatable wafer chuck 320, and is near an edge of a bottom surface opposite to the edge of the top surface of a semiconductor wafer 110 positioned on the rotatable wafer chuck 320. The second nozzle 220 is used to spray the wafer treatment solution 230 to the edge of the bottom surface of the semiconductor wafer 110.

Figure 4:
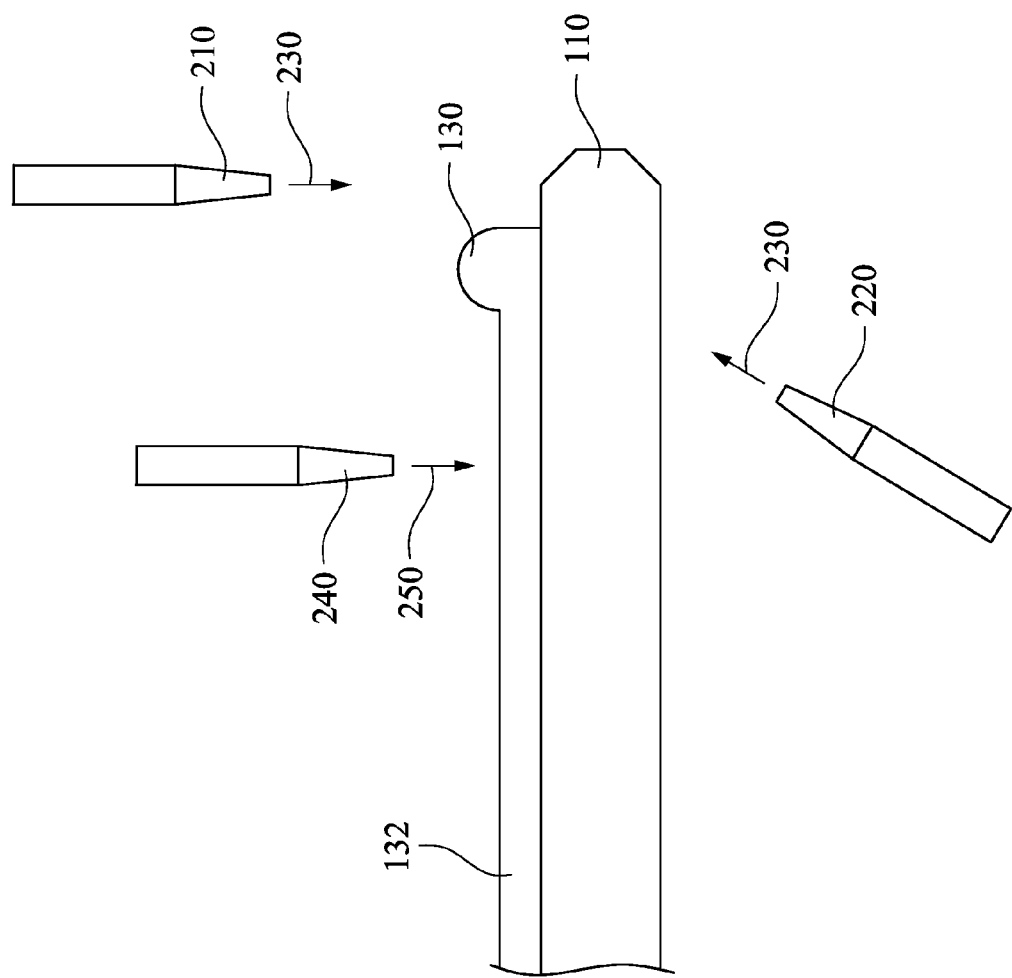
FIG. 4 is a schematic cross-sectional view of a semiconductor wafer 110 according an embodiment of the present disclosure, and the semiconductor wafer 110 is positioned in an apparatus for edge bead removal and inhibiting the formation of edge film humps.

FIG. 4 is a schematic cross-sectional view of a semiconductor wafer 110 according an embodiment of the present disclosure, and the semiconductor wafer 110 is positioned in an apparatus for edge bead removal and inhibiting the formation of edge film humps. In FIG. 4, the apparatus further includes a third nozzle 240 positioned on the rotatable wafer chuck, and near an edge of the top surface of the semiconductor wafer 110. The third nozzle 240 is used to spray a solution 250 to the edge of the top surface of the semiconductor wafer 110.

According to various embodiments of the present disclosure, the solution 250 and the solution of the wafer treatment solution 230 are individually selected from the group consisting of propylene glycol methyl ether (PGME), propylene glycol methyl ether acetate (PGMEA), cyclohexanol, cyclohexanone, γ-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

According to various embodiments of the present disclosure, the solution of the wafer treatment solution 230 is a mixed solution of PGME and PGMEA, and the weight ratio of PGME and PGMEA is 70:30.

According to various embodiments of the present disclosure, the solution 250 is a mixed solution of PGME and PGMEA, and the weight ratio of PGME and PGMEA is 70:30.

Figure 5B:
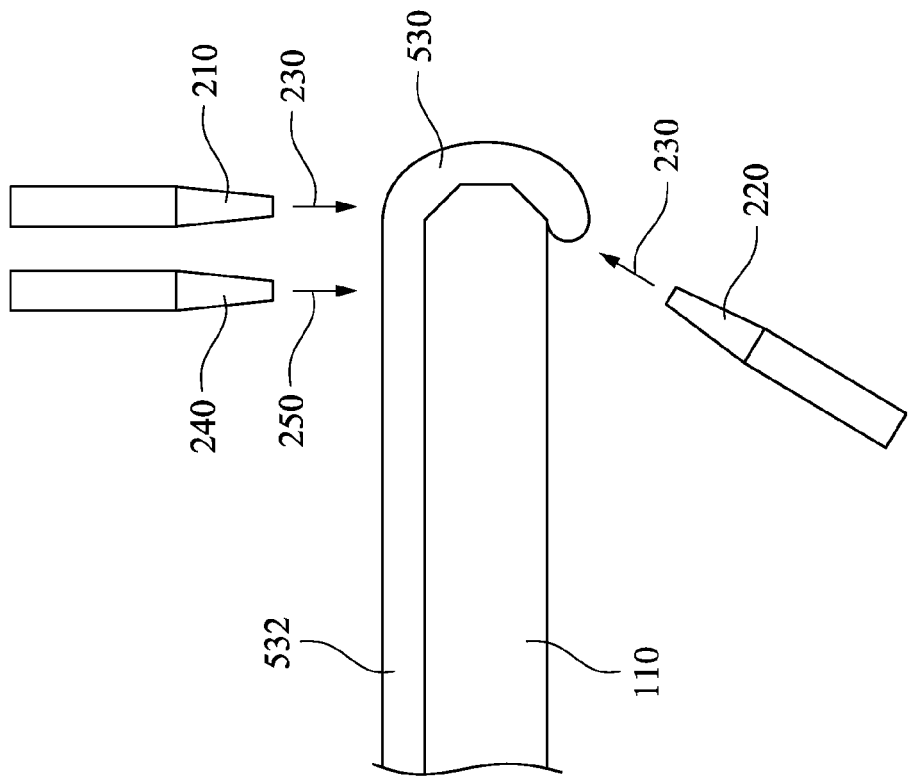
FIGS. 5A-5B is a schematic cross-sectional view of a semiconductor wafer 110 according an embodiment of the present disclosure, and the semiconductor wafer 110 is positioned in an apparatus for edge bead removal and inhibiting the formation of edge film humps.
Figure 5A:
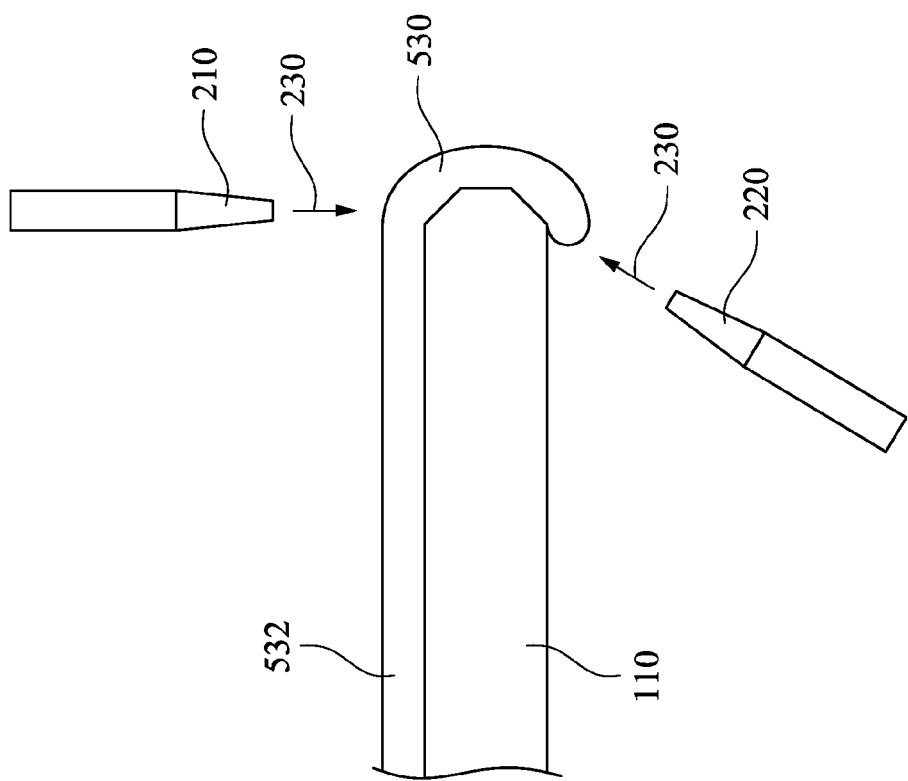

FIGS. 5A-5B is a schematic cross-sectional view of a semiconductor wafer 110 according an embodiment of the present disclosure, and the semiconductor wafer 110 is positioned in an apparatus for edge bead removal and inhibiting the formation of edge film humps. In FIG. 5A, a photoresist layer 532 is formed on the semiconductor wafer 110, and the photoresist layer 532 has a plurality of edge bead 530 formed on edges of the semiconductor wafer 110.

In the apparatus for edge-bead removal and inhibiting a formation of edge film humps, the first nozzle 210 is used to spray the wafer treatment solution 230 to the edge of the top surface of the semiconductor wafer 110. The second nozzle 220 is used to spray the wafer treatment solution 230 to the edge of the bottom surface of the semiconductor wafer 110. According to various embodiments of the present disclosure, the wafer treatment solution 230 is a wafer treatment solution containing a fluorine-containing additive, and the fluorine-containing additive has compound of a formula (I), (II), (III) or (IV). The intermolecular interactions among photoresist polymers are reduced and isolated by the non-polar functional group of the fluorine-containing additive, so as to prevent forming the edge film humps and perform the edge-bead removal.

Referring to FIG. 5B, the apparatus further includes a third nozzle 240 positioned on the rotatable wafer chuck, and near an edge of the top surface of the semiconductor wafer 110, according to various embodiments of the present disclosure. The third nozzle 240 is used to spray a solution 250 to the edge of the top surface of the semiconductor wafer 110.

According to various embodiments of the present disclosure, the solution 250 is selected from the group consisting of propylene glycol methyl ether (PGME), propylene glycol methyl ether acetate (PGMEA), cyclohexanol, cyclohexanone, γ-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

According to various embodiments of the present disclosure, the solution 250 is a mixed solution of PGME and PGMEA, and the weight ratio of PGME and PGMEA is 70:30.

Figure 6:
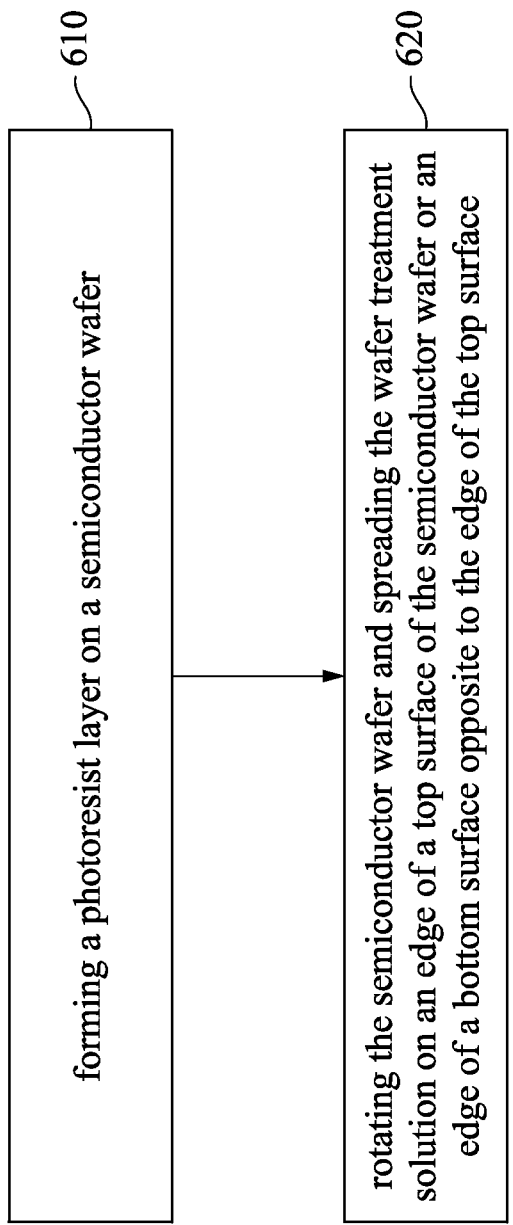
FIG. 6 is a flow chart of a method for removing edge film humps according an embodiment of the present disclosure.

FIG. 6 is a flow chart of a method for removing edge film humps according an embodiment of the present disclosure. Referring to the steps 610, 620 and FIG. 2A, the step 610 is forming a photoresist layer 132 on the semiconductor wafer 110. According to various embodiments of the present disclosure, the photoresist layer 132 may be a KrF photoresist material, an ArF photoresist material, an EUV photoresist material, an E-beam photoresist material, a bottom anti-reflective coating photoresist material (BARC), a top anti-reflective coating photoresist material (TARC), a trilayer under layer or a trilayer bottom layer formed of a photoresist material—an organic anti-etching anti-reflective photoresist material, a trilayer middle layer or a trilayer silicon hard mask layer formed of a photoresist material, an inorganic anti-etching anti-reflective photoresist material, a direct self assembly photoresist material (DSA), a spin on glass (SOG), a low-K material or a combination thereof.

According to various embodiments of the present disclosure, a photoresist layer 132 is coated on the semiconductor wafer 110. According to various embodiments of the present disclosure, the coating method may be a spin-coating method. The spin-coating method is performed to coat materials on the semiconductor wafer 110 by a non-constant rotating speed to provide a uniform film thickness. According to various embodiments of the present disclosure, the rotating speed of the semiconductor wafer in coating may be in a range of 500-3000 rpm. According to various embodiments of the present disclosure, the rotating speed of the semiconductor wafer in coating may be in a range of 1000-2000 rpm.

According to various embodiments of the present disclosure, the photoresist layer 132 is coated by another nozzle which is like the first nozzle 210 and the third nozzle 240 near the center of the semiconductor wafer 110, and the nozzle sprays 0.4-3 ml of a photoresist material. In addition, the semiconductor wafer 110 is rotated, and the wafer treatment solution 230 is spray on an edge of a top surface of the semiconductor wafer 110 or an edge of a bottom surface opposite to the edge of the top surface. According to various embodiments of the present disclosure, the rotating speed of the semiconductor wafer may be in a range of 500-3500 rpm. According to various embodiments of the present disclosure, the rotating speed of the semiconductor wafer may be in a range of 1500-2500 rpm. According to various embodiments of the present disclosure, 1-30 ml of the wafer treatment solution 230 is spray by the first nozzle 210 in a non-constant flow rate. According to various embodiments of the present disclosure, the amount of the wafer treatment solution 230 is preferred in a range of 2-10 ml.

According to various embodiments of the present disclosure, the first nozzle 210 may have different angles in need to provide different cleaning efficiencies. According to various embodiments of the present disclosure, the angle between the first nozzle 210 and the wafer surface may be in a range of 90° to 15°. According to various embodiments of the present disclosure, the angle between the first nozzle 210 and the wafer surface may be in a range of 30° to 45°.

The wafer treatment solution 230 is spray inward 8 mm from the edge of the top surface of the semiconductor wafer 110. According to various embodiments of the present disclosure, with regard to have the most dicing dies on the wafer surface, the wafer treatment solution 230 has an optimal spray distance of less than 3 mm from the edge of the top surface of the semiconductor wafer 110.

The wafer treatment solution 220 is spray inward everywhere from the edge of the bottom surface of the semiconductor wafer 110, so as to provide cleaning the contamination at the bottom surface of the semiconductor wafer and edge-bead removal. According to various embodiments of the present disclosure, with regard to have the most dicing dies on the wafer surface, the wafer treatment solution 220 has an optimal spray distance of less than 5 cm from the edge of the bottom surface of the semiconductor wafer 110. According to various embodiments of the present disclosure, the semiconductor wafer 110 is positioned on and in contact with the rotatable wafer chuck 320, as shown in FIG. 3. According to various embodiments of the present disclosure, the wafer treatment solution 230 is a wafer treatment solution containing a fluorine-containing additive, and the fluorine-containing additive has compound of a formula (I), (II), (III) or (IV).

Referring to FIGS. 5 and 6 and steps 610 and 620, according to various embodiments of the present disclosure, the solution 250 is spray on the edge of the top surface of the semiconductor wafer 110 before spraying the wafer treatment solution 230. According to various embodiments of the present disclosure, the wafer treatment solution 230 and the solution 250 are spray on the edge of the top surface of the semiconductor wafer 110 at the same time. According to various embodiments of the present disclosure, the solution 250 is spray on the edge of the top surface of the semiconductor wafer 110 after spraying the wafer treatment solution 230.

According to various embodiments of the present disclosure, the solution 250 is selected from the group consisting of propylene glycol methyl ether (PGME), propylene glycol methyl ether acetate (PGMEA), cyclohexanol, cyclohexanone, γ-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

According to various embodiments of the present disclosure, the solution 250 is a mixed solution of PGME and PGMEA, and the weight ratio of PGME and PGMEA is 70:30.

Figure 7:
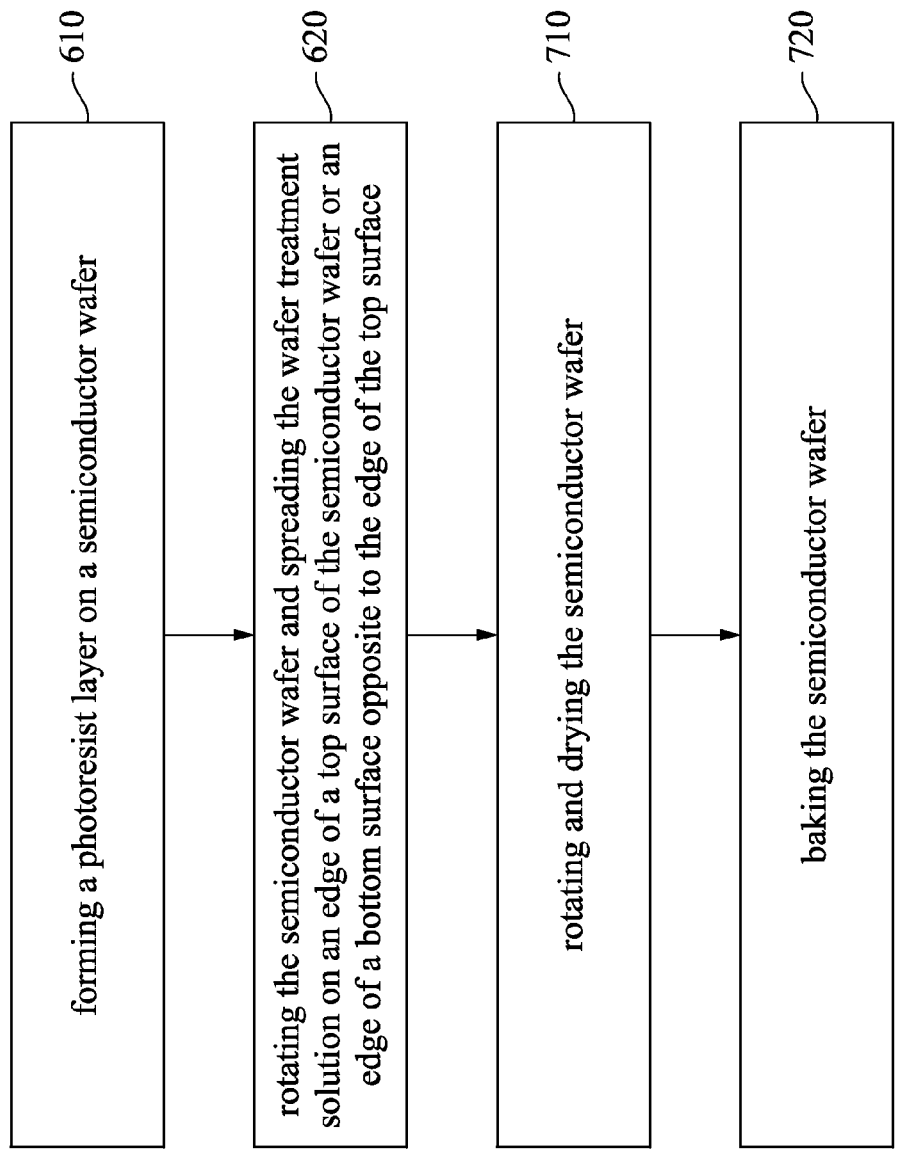
FIG. 7 is a flow chart of a method for removing edge film humps according an embodiment of the present disclosure.

FIG. 7 is a flow chart of a method for removing edge film humps according an embodiment of the present disclosure. Referring to steps 620, 710 and 720, after spraying the wafer treatment solution 230, the semiconductor wafer 110 is spin-dried, and then is baked. According to various embodiments of the present disclosure, the rotating speed of spin-drying the semiconductor wafer may be in a range of 1000-3000 rpm. According to various embodiments of the present disclosure, the rotating speed of spin-drying the semiconductor wafer may be in a range of 2000-2500 rpm. According to various embodiments of the present disclosure, a heating temperature of baking the semiconductor wafer is in a range of 60-300° C. According to various embodiments of the present disclosure, a heating temperature of baking the semiconductor wafer is in a range of 80-120° C.

Figure 8:
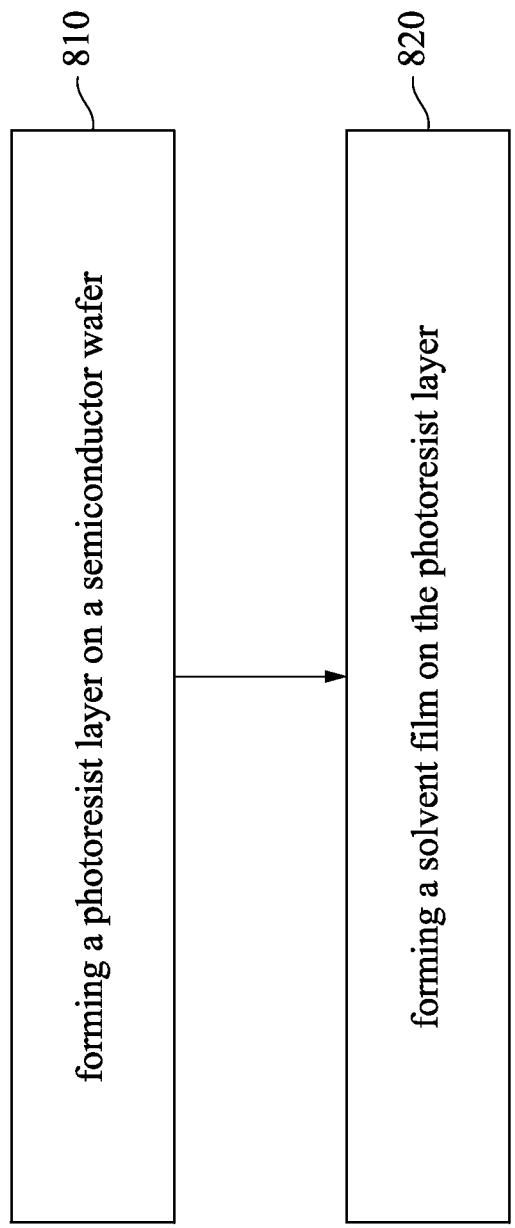
FIG. 8 is a flow chart of a method for flattening a photoresist surface of a semiconductor wafer according an embodiment of the present disclosure.

FIG. 8 is a flow chart of a method for flattening a photoresist surface of a semiconductor wafer according an embodiment of the present disclosure. Referring to the steps 810 and 820, the photoresist layer is formed on the semiconductor wafer, and then the solvent film is formed on the photoresist layer. The solvent film is formed by spin-coating, atomization spraying or evaporation spraying.

According to various embodiments of the present disclosure, when the solvent film is formed by spin-coating, the solvent is spray by another nozzle which is like the first nozzle 210 and the third nozzle 240 near the center of the semiconductor wafer 110. According to various embodiments of the present disclosure, the rotating speed of the semiconductor wafer in coating may be in a range of 500-3000 rpm. According to various embodiments of the present disclosure, the rotating speed of the semiconductor wafer in coating may be in a range of 1000-2000 rpm. According to various embodiments of the present disclosure, the amount of the solvent material is in a range of 0.4-30 ml. According to various embodiments of the present disclosure, the amount of the solvent material is in a range of 1-10 ml.

According to various embodiments of the present disclosure, when the solvent film is formed by atomization spraying, the wafer treatment solution may be atomized by injecting gas into the wafer treatment solution. Further, the atomized wafer treatment solution is transported to the wafer surface to form the solvent film. According to various embodiments of the present disclosure, the gas may be selected from a group consisting of clean dry air (CDA), nitrogen, argon and a combination thereof.

According to various embodiments of the present disclosure, when the solvent film is formed by evaporation spraying, the wafer treatment solution is heated to form a vapor of the wafer treatment solution. Further, the vapor of the wafer treatment solution is transported to the wafer surface to form the solvent film. According to various embodiments of the present disclosure, the solvent film is formed of a wafer treatment solution which is a wafer treatment solution containing a fluorine-containing additive, and the fluorine-containing additive has compound of a formula (I), (II), (III) or (IV). According to various embodiments of the present disclosure, the solution of the wafer treatment solution is an aqueous solution, an alcohol solution or other organic solvent. The solution is selected from the group consisting of propylene glycol methyl ether (PGME), propylene glycol methyl ether acetate (PGMEA), cyclohexanol, cyclohexanone, γ-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

According to various embodiments of the present disclosure, the method for flattening the photoresist layer surface of the semiconductor wafer further includes performing a heating process after forming the solvent film on the photoresist layer. According to various embodiments of the present disclosure, a heating temperature of the heating process is in a range of 90-140° C., and a heating time is in a range of 60-90 seconds.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. A wafer treatment solution, comprising:
a solution; and
a fluorine-containing additive dispersed in the solution, and having a compound of a formula (I):

wherein $R_f$ is a C1-C6 fluorine-containing alkyl group,
R1 is hydrogen, a C1-C3 alkyl group, a C1-C3 carboxylic group, or a C1-C3 amino group (—NH$_2$),
X is —O—, —NH—, —SO$_3$NH— —COO—, —CH2O— or —CO—, and
m is an integer of 1-6; or
a compound of a formula (II):

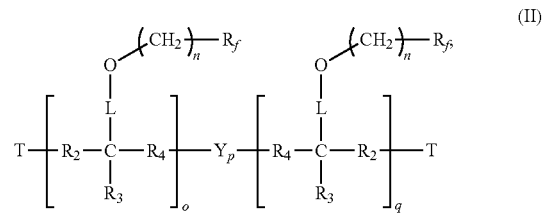

wherein $R_f$ is a C1-C6 fluorine-containing alkyl group,
R2 is —CH$_2$—,
R$_3$ is a C1-C3 alkyl group, a C1-C3 alkoxyl group, a C1-C3 alkyloyl group, amino group (—NH$_2$) or hydroxyl group (—OH),
R4 is —CH$_2$O— or —CH$_2$—,
Y is

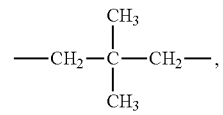

L is unsubstituted or —(CH$_2$)$_n$—,
n is an integer of 1-3,
o and q are individually an integer of 1-8,
p is an integer of 1-3, and
T is —OH, —OSO$_3^-$NH$_4^+$, —OSO$_3^-$Na$^+$, —OSO$_3^-$K$^+$, —NH$_2$ or —COOH.

2. The wafer treatment solution of claim 1, wherein the fluorine-containing additive has the compound of the formula (II), wherein $R_f$ is a C1-C6 fluorine-containing alkyl group, R2 is —CH$_2$—, R$_3$ is —CH$_3$, R4 is —CH$_2$O—, Y is

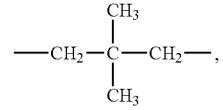

L is —CH$_2$—, n is 2, o and q are individually an integer of 1-8, p is an integer of 1-3, and T is —OH, —OSO$_3^-$NH$_4^+$, —OSO$_3^-$Na$^+$, —OSO$_3^-$K$^+$, —NH$_2$ or —COOH, so that the chemical structure of the fluorine-containing additive is formula (III):

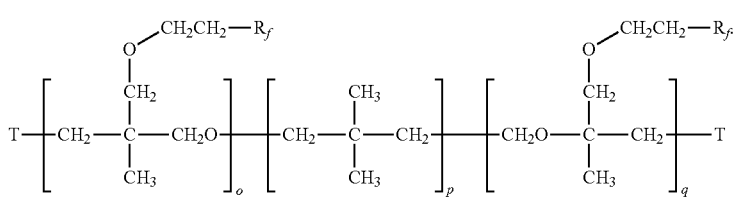

3. The wafer treatment solution of claim 1, wherein the fluorine-containing additive has the compound of the formula (I), wherein $R_f$ is a C6 perfluoroalkyl group, R1 is hydrogen, X is CH2O, and m is between 1 to 6, so that the chemical structure of the fluorine-containing additive is formula (III):

$$CF_3CF_2CF_2CF_2CF_2CF_2CH_2O(CH_2CH_2O)mH \qquad (III).$$

4. The wafer treatment solution of claim 1, wherein the content of the fluorine-containing additive in the wafer treatment solution is in a range of 0.1-5 wt %.

5. The wafer treatment solution of claim 1, wherein the solution is selected from the group consisting of propylene glycol methyl ether (PGME), propylene glycol methyl ether acetate (PGMEA), cyclohexanol, cyclohexanone, □-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

6. The wafer treatment solution of claim 1, wherein the solution is a mixed solution of PGME and PGMEA, and the weight ratio of PGME and PGMEA is 70:30.

7. A method for edge-bead removal, comprising:
forming a photoresist layer on a semiconductor wafer, the semiconductor wafer is positioned on and in contact with a rotatable wafer chuck; and
rotating the semiconductor wafer and spraying the wafer treatment solution of claim 1 on an edge of a top surface of the semiconductor wafer or an edge of a bottom surface opposite to the edge of the top surface.

8. The method of claim 7, further comprising spraying a solution on the edge of the top surface of the semiconductor wafer after spraying the wafer treatment solution.

9. The method of claim 7, further comprising spraying a solution on the edge of the top surface of the semiconductor wafer before spraying the wafer treatment solution.

10. The method of claim 7, wherein spraying the wafer treatment solution further comprises spraying a solution on the edge of the top surface of the semiconductor wafer at the same time.

11. The method of claim 10, wherein the solution and the solution of the wafer treatment solution are individually selected from the group consisting of propylene glycol methyl ether (PGME), propylene glycol methyl ether acetate (PGMEA), cyclohexanol, cyclohexanone, □-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

12. The method of claim 11, wherein the solution and the solution of the wafer treatment solution are a mixed solution of PGME and PGMEA, and the weight ratio of PGME and PGMEA is 70:30.

13. The method of claim 7, further comprising decreasing a thickness of at least one edge film hump on the semiconductor wafer by the wafer treatment solution.

14. The method of claim 13, wherein the thickness of the edge film hump is decreased at least 50%.

15. An apparatus for edge-bead removal, comprising:
a rotatable wafer chuck;
a first nozzle positioned on the rotatable wafer chuck, and near an edge of a top surface of a semiconductor wafer on the rotatable wafer chuck, wherein the first nozzle is used to spray the wafer treatment solution of claim 1 to the edge of the top surface of the semiconductor wafer; and
a second nozzle positioned under the rotatable wafer chuck, and near an edge of a bottom surface opposite to the edge of the top surface of a semiconductor wafer positioned on the rotatable wafer chuck, wherein the second nozzle is used to spray the wafer treatment solution of claim 1 to the edge of the bottom surface of the semiconductor wafer.

16. The apparatus of claim 15, further comprising a third nozzle positioned on the rotatable wafer chuck, and near an edge of the top surface of the semiconductor wafer on the rotatable wafer chuck, wherein the third nozzle is used to spray a solution to the edge of the top surface of the semiconductor wafer.

17. The apparatus of claim 16, wherein the solution and the solution of the wafer treatment solution are individually selected from the group consisting of propylene glycol methyl ether (PGME), propylene glycol methyl ether acetate (PGMEA), cyclohexanol, cyclohexanone, □-butyrolactone (GBL), N-methyl-2-pyrrolidone (NMP), n-butyl acetate (NBA), methyl ethyl ketone (MEK), diacetone alcohol (DAA), methyl isobutyl ketone (MIBK), dimethyl sulfoxide (DMSO), water, ethanol, propanol, butanol, isopropyl alcohol (IPA), 4-methyl-2-pentanol (MIBC) and a combination thereof.

18. A method for flattening a photoresist layer on a surface of a semiconductor wafer, comprising:
forming the photoresist layer on the semiconductor wafer, and
forming a solvent film on the photoresist layer, the solvent film is formed of the wafer treatment solution of claim 1.

19. The method of claim 18, further comprising performing a heating process after forming the solvent film on the photoresist layer.

20. The method of claim 19, wherein a heating temperature of the heating process is in a range of 90-140° C., and a heating time is in a range of 60-90 seconds.

* * * * *